United States Patent
Li et al.

(10) Patent No.: US 10,666,267 B2
(45) Date of Patent: May 26, 2020

(54) SEGMENTATION SUPERPOSITION TECHNIQUE FOR BINARY ERROR COMPENSATION

(71) Applicant: Taiwan Semiconductor Manufacturing Company Limited, Hsinchu (TW)

(72) Inventors: Chao Chieh Li, Hsinchu (TW); Chia-Chun Liao, Taipei (TW); Min-Shueh Yuan, Taipei (TW); Robert Bogdan Staszewski, Delft (NL)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 142 days.

(21) Appl. No.: 15/940,300

(22) Filed: Mar. 29, 2018

(65) Prior Publication Data

US 2019/0068199 A1 Feb. 28, 2019

Related U.S. Application Data

(60) Provisional application No. 62/551,373, filed on Aug. 29, 2017.

(51) Int. Cl.
| | | |
|---|---|---|
| *H03L 1/02* | (2006.01) | |
| *H03B 5/08* | (2006.01) | |
| *H03L 7/099* | (2006.01) | |
| *H03L 1/00* | (2006.01) | |

(52) U.S. Cl.
CPC ............. *H03L 1/022* (2013.01); *H03B 5/08* (2013.01); *H03L 1/00* (2013.01); *H03L 7/099* (2013.01); *H03L 7/0991* (2013.01); *H03B 2201/025* (2013.01)

(58) Field of Classification Search
CPC . H03L 1/00; H03L 1/022; H03L 7/099; H03L 7/0991; H03L 7/085; H03B 5/08; H03B 2201/025
See application file for complete search history.

(56) References Cited

U.S. PATENT DOCUMENTS

| | | | | |
|---|---|---|---|---|
| 6,658,748 | B1 * | 12/2003 | Leipold .................. | H03K 3/354 327/156 |
| 2004/0041671 | A1 * | 3/2004 | Van Rumpt ............. | H03J 5/246 334/30 |
| 2015/0015343 | A1 * | 1/2015 | Ballantyne ............ | H03L 7/0991 331/36 C |
| 2018/0183442 | A1 * | 6/2018 | Pavao Moreira ......... | H03L 1/02 |

\* cited by examiner

*Primary Examiner* — Jeffrey M Shin
(74) *Attorney, Agent, or Firm* — Jones Day (57) ABSTRACT

Systems and methods for compensating a non-linearity of a digitally controlled oscillator (DCO) are presented. Data comprising a plurality of silicon measurements is received. Each silicon measurement in the plurality of silicon measurements is compared to an ideal value. Based on the comparing, a plurality of compensation vectors is generated. Each compensation vector comprises at least one silicon measurement. At least one frequency is adjusted based on a compensation vector in the plurality of compensation vectors. A digitally-controlled oscillator frequency is generated based on the adjusted at least one frequency.

20 Claims, 9 Drawing Sheets

| Bit Number | Ideal Value | Silicon Data | Seg. Binary | Compensated Value |
|---|---|---|---|---|
| B0 | — | 5 | — | — |
| B1 | 10 | 10 | B1 | 10 |
| B2 | 20 | 30 | B0+B1 | 15 |
| B3 | 40 | 50 | B0+B1+B2 | 45 |
| B4 | 80 | 70 | B0+B4 | 75 |
| B5 | 160 | 160 | B5 | 160 |
| B6 | 320 | 300 | B0+B1+B6 | 315 |

SEGMENTATION SUPERPOSITION TECHNIQUE FOR BINARY ERROR COMPENSATION

CROSS-REFERENCE TO RELATED APPLICATIONS

This application claims priority to U.S. Provisional Application No. 62/551,373, filed Aug. 29, 2017, entitled "Segmentation Superposition Technique for Binary Error Compensation," which is incorporated herein by reference in its entirety.

FIELD

This application relates generally to digitally controlled oscillators (DCOs), and more specifically to DCOs that have non-linear behaviors.

BACKGROUND

A DCO is a component of an all-digital phase locked loop (ADPLL), which is commonly used in advanced CMOS technology. DCOs can be implemented in a variety of ways. An LC-based DCO, one type of DCO, can often achieve better phase noise (PN), lower power consumption, lower frequency pushing, and greater resistance to process and temperature variations than its counterparts.

An LC-based DCO utilizes an arrangement of one or more capacitors to control its frequency (e.g., using a bank of tuning capacitors). A capacitor tuning bank of an LC-based DCO is often implemented using a binary weighting technique. A binary weighted design offers a typically more compact layout, compared to other techniques, e.g., thermal meter arrangements, at the cost of linearity. Non-linearity of a binary weighted design can result in phase error in the DCO output.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An LC-based DCO may utilize a capacitor bank to control its frequency output. Each capacitor in the capacitor tuning bank in a DCO has a corresponding switch. When the corresponding switch is activated, the capacitor is activated. The switches are activated by a digital control signal, which may be referred to as a binary code. The activated capacitors make a frequency contribution to the DCO frequency output. Thus, the DCO frequency output is controlled by activating a particular combination of switches. For example, in a binary weighted design, each capacitor in the capacitor bank makes a frequency contribution greater than a previous capacitor by a factor of two. As a result, the layout area of each capacitor is two times larger than the layout area of the previous capacitor.

As noted above, the binary weighted design can offer several advantages over other tuning capacitor bank arrangements, including area savings, limited parasitic capacitances among capacitors in the bank, and a control bus of limited complexity. But binary weighted tuning capacitor banks are susceptible to process variations that can occur during fabrication of the capacitors and switches. Due to process variation across an overall layout of the capacitor bank in the binary weighted design, an actual DCO gain, i.e., a change in frequency between one binary code and the next binary code, is not linear. Put another way, there exists a difference between the desired frequency output and an actual frequency output of activated capacitors. Such nonlinearity materializes as a phase error in the DCO frequency output. Systems and methods described herein alleviate that phase error by measuring and compensating for the nonlinearity.

Figure 1:
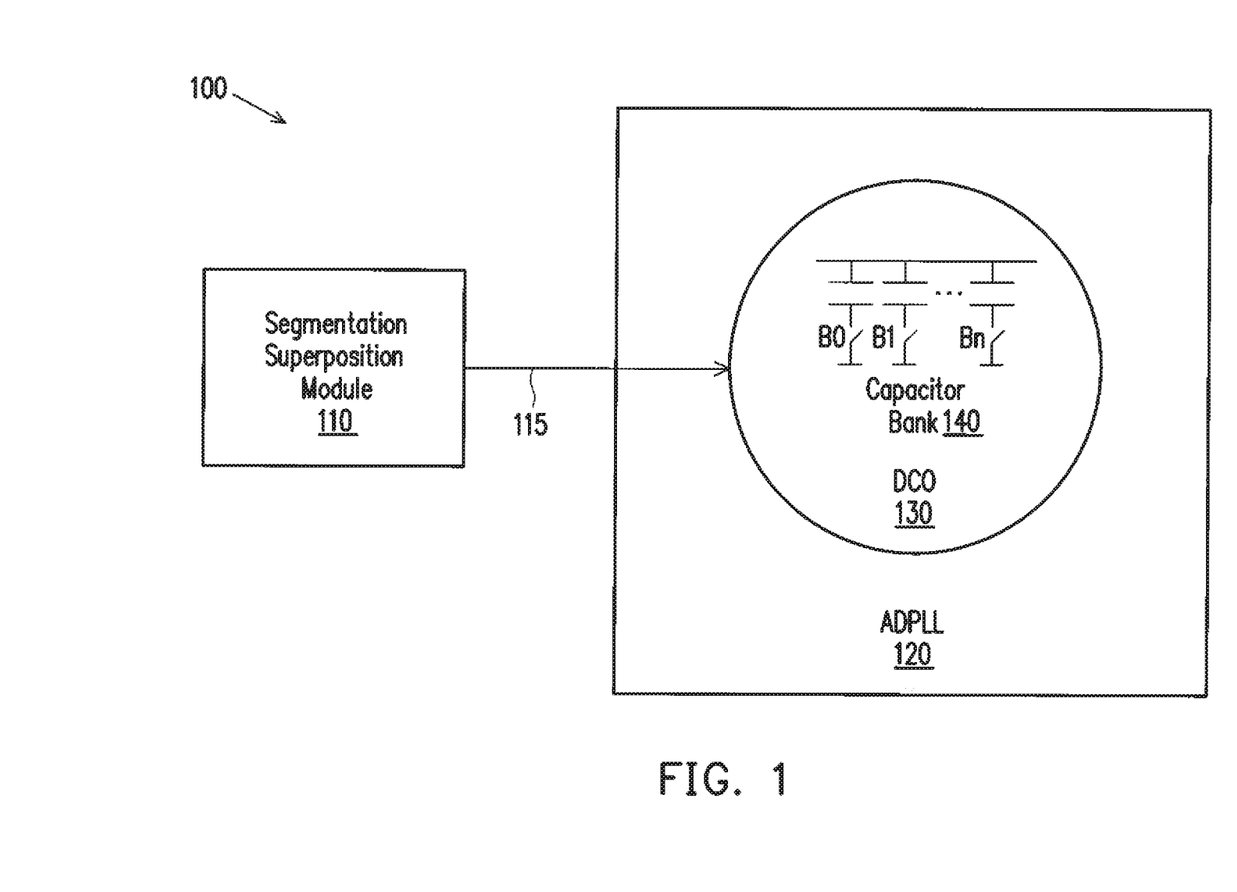
FIG. 1 depicts an example block diagram depicting the interconnectivity between a segmentation superposition module and an ADPLL, according to some embodiments.

In certain embodiments, a segmentation superposition module, as described further herein, interacts with an ADPLL to alleviate phase error. FIG. 1 depicts an example block diagram 100 depicting the interconnectivity between a segmentation superposition module 110 and an ADPLL 120, according to some embodiments. The ADPLL 120 includes a DCO 130, and the DCO 130 includes a capacitor bank 140. The capacitors in the capacitor bank may be metal-oxide-metal (MOM) capacitors, but the capacitors are not limited to being MOM capacitors.

The segmentation superposition module 110 provides a control signal 115 to the DCO to generate a desired output frequency. Specifically, the control signal from the segmentation superposition module 110 controls switches in the capacitor bank 140 to activate selected capacitors to generate a desired frequency output. An activation of a switch is based on a value of a bit represented in the control signal from the segmentation superposition module 110. The bits can be represented by B0 . . . Bn. If a switch is activated, a path is formed that includes a corresponding capacitor in frequency generation. Thus, a bit in the control signal from the segmentation superposition module 110 is associated with a capacitor. Each activated capacitor provides a frequency contribution to a total output frequency. In a binary weighted design, the frequency contribution from consecutive capacitors grows in size by a power of 2. For example, B1 could be associated with a capacitor that contributes 10 kHz to the total frequency output. B2 could be associated with a capacitor that contributes $10*2^1$ kHz, or 20 kHz, to the total frequency output. B14 could be associated with a capacitor that contributes $10*2^{13}$ kHz, or 81,920 kHz, to the total frequency output. By selectively activating capacitors in the capacitor bank 140 using signals from the segmentation superposition module 110, a frequency output of the DCO 130 can be controlled.

In embodiments herein, the segmentation superposition module 110 includes logic for implementing a segmentation superposition technique that determines a set of compensation factors that compensate for nonlinearities of the capacitors in the capacitor bank 140 of the DCO 130. The nonlinearities may arise from a number of factors, including the layout of the capacitors in the capacitor bank 140. Potential causes of nonlinearities are further discussed below with reference to FIGS. 5 and 6.

Figure 2:
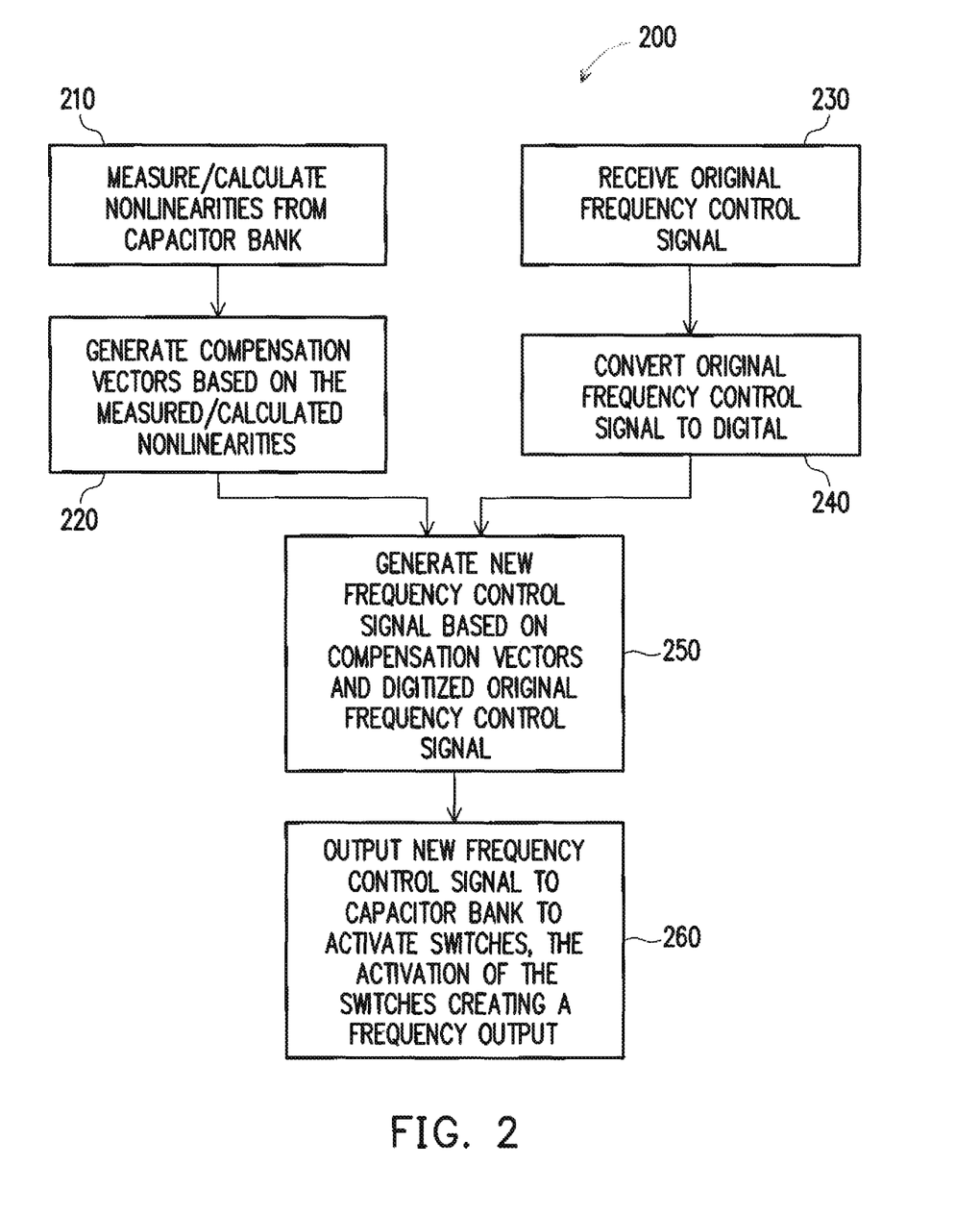
FIG. 2 depicts an example flow diagram depicting an algorithm executed by a segmentation superposition module.

FIG. 2 depicts an example flow diagram 200 depicting an algorithm executed by a segmentation superposition module, e.g., segmentation superposition module 110, to compensate for nonlinearities of a capacitor bank, e.g., capacitor bank 140, in a DCO, e.g., DCO 130. At 210, nonlinearities are measured and/or calculated from the capacitor bank. These measurements and calculations are described further below. The measurements/calculations estimate the nonlinearity of each capacitor. The nonlinearity represents a difference between the actual frequency contribution value from each capacitor and the expected frequency contribution value from that capacitor. Compensation vectors that correspond to bits in a binary code that produces a desired output frequency are generated at 220. The compensation vectors are generated based on the measurements and/or calculations performed at 210. Because the compensation vectors account for the measurements/calculations, the compensation vectors can be used to produce an actual output frequency that is closer a desired output frequency. The generation of the compensation vectors is further discussed below, with reference to FIGS. 3 and 8. After being generated, the compensation vectors are stored in a compensation lookup table. The storage of the compensation vectors may occur once, prior to the execution of the remaining steps of the algorithm. In another example, determination and storage of compensation vectors may be repeated during the life of the DCO 130. At 230, an original frequency control signal is received. This is the frequency that is ultimately desired to be output by the DCO 130. If the original frequency control signal is analog, it will be converted into a digital signal at 240. Because driving the DCO with the original frequency control signal would result an erroneous frequency output due to nonlinearities, at 250, a new frequency control signal is generated based on the compensation vectors generated at 220 and the digital frequency control signal generated at 240, or alternatively, received at 230, if the original frequency control signal is digital. At 260, a new frequency control signal is output to the capacitor bank to activate switches. The activation of the switches in the DCO, e.g., DCO 130, creates a frequency output.

Figure 3:
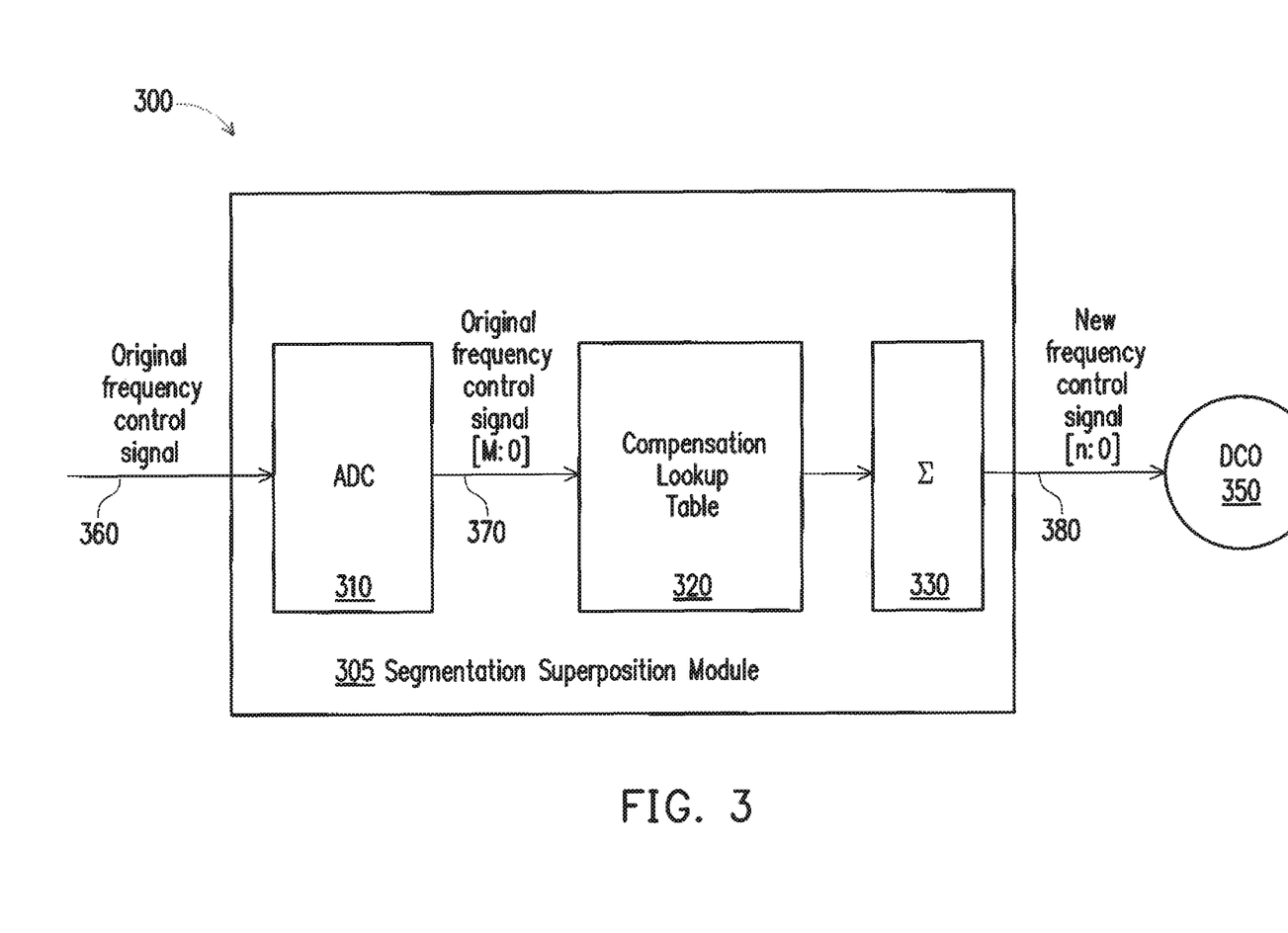
FIG. 3 depicts an example block diagram depicting an apparatus for implementing a segmentation superposition technique to compensate for nonlinearities in a binary weighted design of a capacitor tuning bank of a DCO, according to some embodiments.

FIG. 3 depicts an example block diagram depicting an example apparatus 300 for implementing a segmentation superposition technique to compensate for the nonlinearities inherent in a binary weighted design of a capacitor tuning bank of a DCO, according to some embodiments. The example apparatus executes an algorithm, e.g., the algorithm depicted in FIG. 2. A segmentation superposition module 305 comprises an analog-to-digital converter (ADC) 310, a compensation lookup table 320, and a summation block 330. A DCO 350 receives the output of the segmentation superposition module 305.

An original frequency control signal 360 is received by the segmentation superposition module 305. The original frequency control signal 360 may come from a digital communication system, e.g., a Bluetooth low energy (BLE) system. In a BLE system, a channel carries packets and has an associated data rate, which corresponds to a time to transmit each packet. The packet time is periodically repeated. Typically in BLE, the channel, associated with a frequency, is randomly-controlled, i.e., the frequency hops from one value to another value. The original frequency control signal 360, i.e., a hopping control signal, used in the present application is not limited to a randomly-controlled implementation. The original frequency control signal could be stored in SRAM and reloaded in a certain time. In one embodiment, the original frequency control signal can request any frequency across an entire range of frequencies required by the system specifications. In BLE, the hopping control signal needs to cover an 80 MHz tuning range at a minimum. The original frequency control signal from the digital communication system may be received by the ADC 310, which converts the original frequency control signal to a digital version of the original frequency control signal with M+1 bits. The ADC 310 outputs an original frequency control signal [M:0] 370. Alternatively, the ADC 310 may be external to the segmentation superposition module 305. The ADC may not be needed if the original frequency control signal 360 is already digital.

The compensation lookup table 320 receives the original frequency control signal [M:0] 370 and uses the values of the bits to select the appropriate compensated control words stored in the compensation lookup table 320. The compensation lookup table 320 stores a compensated control word for each bit in the original frequency control signal [M:0] 370, from 0 to M. Thus, if bit y, corresponding to capacitor z of the DCO, is active, e.g., has a value of 1, in the frequency control signal 370, then capacitor z is to be connected in generating an output. The compensation lookup table 320 includes a record for capacitor z that indicates an amount of compensation that should be applied to account for nonlinearities in capacitor z. That amount of compensation is added or subtracted from the frequency control signal 380 provided to the DCO 350 using summing module 330, where this compensation is, in one embodiment, repeated for each bit of the original frequency control signal 370.

The compensated control words may be stored in an M+1 by n+1 matrix. The number of columns, n, includes the bit numbers in a DCO capacitor bank, e.g., capacitor bank 140, as well as one or more extra bits. The length of the compensation lookup table 320, n, depends on the resolution required by system to correct the INL or the differential nonlinearity (DNL), and the DCO control bit number. Though the compensation lookup table 320 can store a M+1 by n+1 matrix, it is not limited to a matrix format.

The nonlinearity, or binary error, of a DCO binary controlled capacitor bank can be measured manually in the lab or calculated, e.g., using a least mean squared (LMS) algorithm. Compensated values that reduce the nonlinearity for each of the bits form the basis of the compensated control words. The compensated values are stored in the compensation lookup table 320, according to some embodiments. The compensated control words form the basis for transforming the original frequency control signal to a new DCO control signal in which binary error is reduced or eliminated. The compensated control words are selected according to the binary values of the original frequency control signal [M:0] 370.

The compensated control words stored in the compensation lookup table 320 are based on real silicon measurements taken from capacitors within the capacitor tuning bank. A compensated control word for the original frequency control signal [M:0] 370, bit M, could be represented as $$f_M(seg)=a*seg[0]+b*seg[1]+c*seg[2]+d*seg[3]+\ldots+x*seg[n]$$

where the coefficients a, b, c, d, ... x each represent a binary value of 0 or 1 and seg[0], seg[1], seg[2], seg[3], ... seg[n] each represent a measured or calculated frequency contribution from the corresponding bit, n. For example, the measured or calculated frequency contribution from B2, seg[2], could be 30 kHz. This measured or calculated frequency contribution value could be contrasted with an expected frequency contribution value. Referencing the preceding example, the expected frequency contribution value could be 20 kHz. The compensated control word corresponding to B2 would be created in such a way that compensates for the 10 kHz difference between the measured or calculated frequency contribution value and the expected frequency contribution value. The compensated control word, $f_M(seg)$, is created for each bit from 0 to M.

The summation block 340 receives a combination of compensated control words. The summation block 340 processes the compensated control words. Any combination of the compensated control words can be used to create a compensated DCO output frequency. For example, the compensated DCO output frequency could be represented by $$F_{DCO}(x)=f_0(seg[n:0])+f_1(seg[n:0])+f2(seg[n:0])+\ldots f_M(seg[n:0])$$

The summed compensated control words are received by the control signal generation block 340, which outputs a new frequency control signal [n:0] that is used to control the DCO 350. In the representation above, the DCO output frequency is the summation of each and every compensated control word, from 0 to M. In another example, the DCO output frequency may be the summation of some combination of compensated control words. By applying this superposition technique, the binary error corresponding to each bit could be eliminated or reduced.

The number of bits in a new frequency control signal [n:0] 180 is equal to n+1. In order to have more flexibility in frequency tuning, n should be larger than M. The extra bit(s) will help to compensate for the process variation regardless of whether the binary error is positive or negative. In addition, the extra bit(s) will prevent overflow when the compensated control words are summed by the summation block 340. The overflow could occur if a result was not larger than the addends. For example, if A[10:0]+B[10:0] =C[11:0], then there shouldn't be any overflow because the result, C, is one bit larger than each of the addends, A and B.

The capacitor bank in the DCO can be a binary weighted design with any number of bits. Each controlled bit controls a switched capacitor that corresponds to frequency tuning. The frequency tuning mechanism is not limited to switched capacitor, and instead could also be any mechanism of frequency tuning, including inductive or resistive tuning. In this embodiment, the DCO control bank is designed as a binary weighted implementation (e.g., 10 kHz, 20 kHz, 40 kHz, . . . 81.92 MHz). It is not necessary that the binary weighted capacitor bank activate sequential capacitors. Any combination of capacitors could be activated. Furthermore, the design is not limited to a binary weighted controlled design. Regardless of the chosen design, it is important that the DCO output has a small INL and/or DNL.

Figure 4:
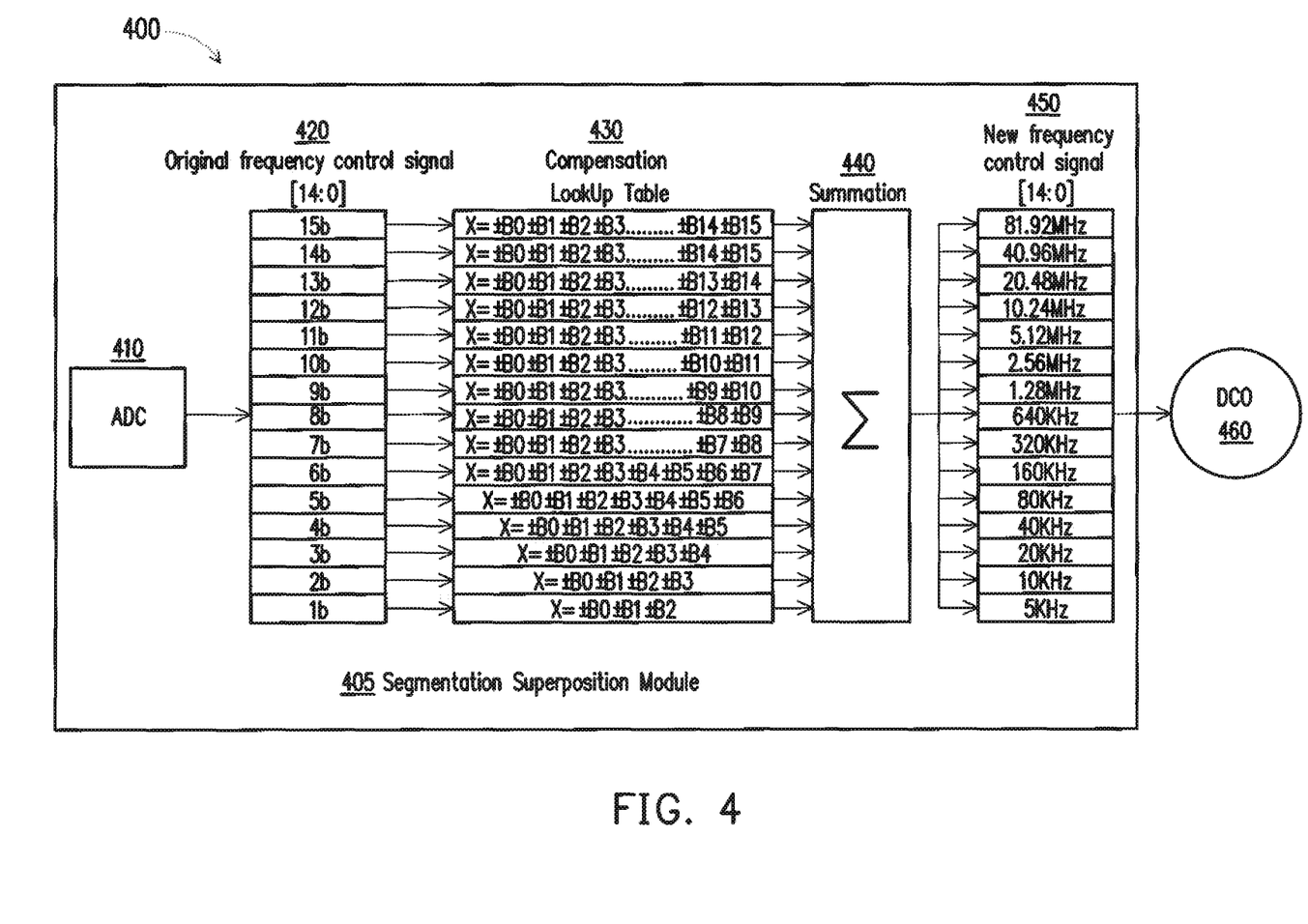
FIG. 4 depicts an exemplary embodiment of the segmentation superposition technique, according to some embodiments.

FIG. 4 depicts an exemplary embodiment 400 of a segmentation superposition technique, according to some embodiments. An ADC 410 receives an original frequency control signal from a communications system. The ADC converts the original frequency control signal if it is an analog signal. In this embodiment, the digitally converted original frequency control signal 420 is comprised of 15 bits. A compensation lookup table 430 receives the digitally converted original frequency control signal 420. The compensation lookup table 430 includes fifteen controlled compensation words, wherein each compensated control word comprises up to fifteen addends, wherein each addend corresponds to a bit from the original frequency control signal. As an example, the compensated control word for bit 1 is X=B0+B1+B2. The addends used in the compensated control word are: (i) B0, which represents a measured value of the silicon corresponding to bit 0; (ii) B1, which represents a measured value of the silicon corresponding to bit 1; and (iii) B2, which represents a measured value of the silicon corresponding to bit 2. The aforementioned values, B0, B1, and B2, may be added or subtracted to arrive at the compensated control word, as indicated by the "±" symbol. A summation block 440 sums the selected compensated control words. A new frequency control signal 450 is comprised of fifteen bits that represent frequencies ranging from 5 kHz (½*10*$2^0$ kHz) to 81.92 MHz (10*$2^{13}$ kHz). A DCO 460 receives the control signal and outputs a desired frequency based on the control signal.

Figure 5:
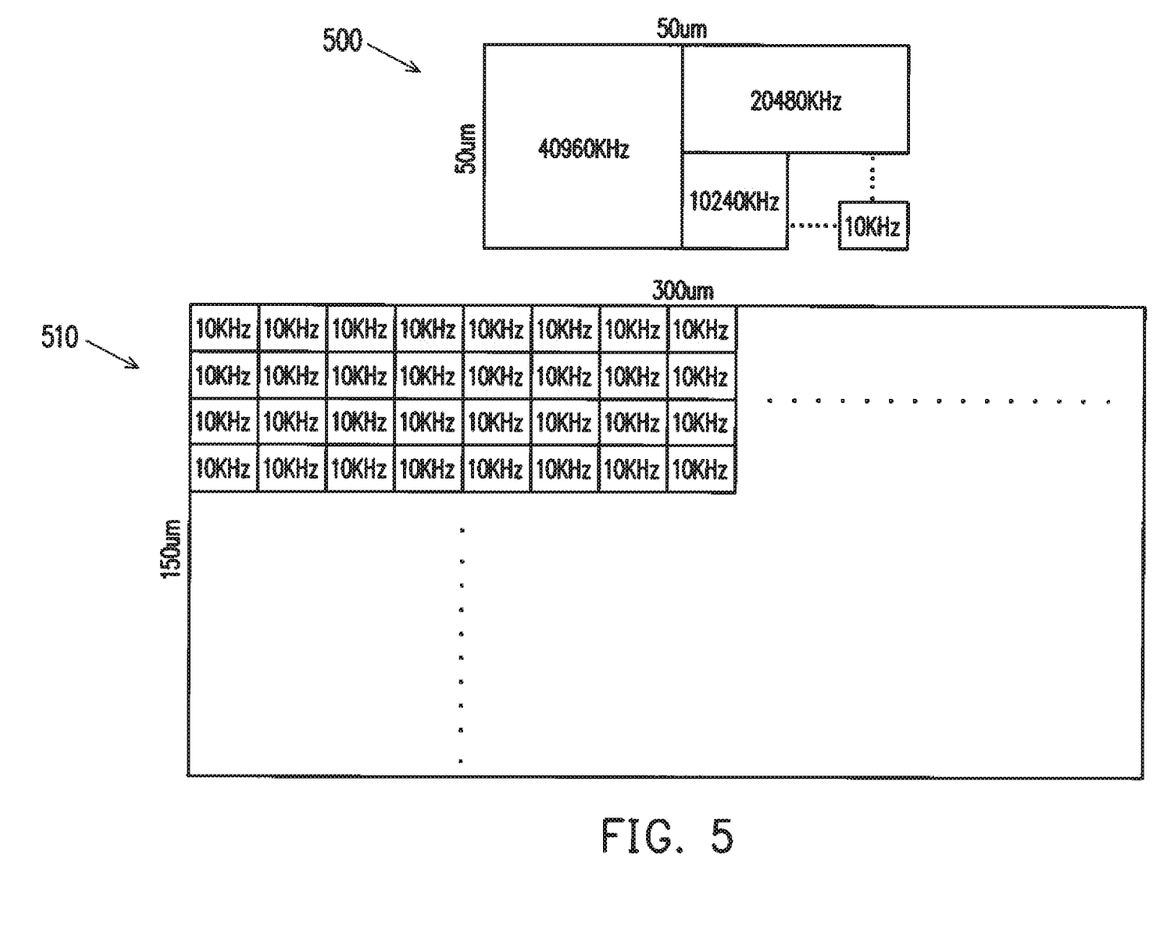
FIG. 5 depicts an example layout for a binary weighted capacitor bank design and an example layout for a thermal meter capacitor bank design, according to some embodiments.

FIG. 5 depicts an example layout for a binary weighted capacitor bank design 500 and an example layout for a thermal meter capacitor bank design 510. In the thermal meter design 510, each rectangle in the layout represents a bit corresponding to a frequency of 10 kHz. The thermal meter design 510 consumes more area due to the space between MOM capacitors and repeated switched MOS transistors. Furthermore, the amount of controlled bus needed in the thermal meter design 510 can cause layout complexity and excess parasitic capacitance over the entire capacitor bank. Typically, the thermal meter design 510 is preferable for its more linear behavior, e.g., smaller INL and DNL, in order to precisely tune the DCO frequency.

In the binary weighted capacitor bank design 500, each rectangle in the layout represents a bit corresponding to a frequency of 10 kHz*$2^{n-1}$ where n is the bit number. The binary weighted design 400 achieves a more compact layout. In the binary weighted capacitor bank, each bit will have a unique size of MOM capacitor and MOS switch, resulting in a smaller layout for lower bits and a larger layout for higher bits. Due to the different layout sizes for different bits, an overall layout that is more compact is achieved. However, there will still be some mismatch resulting from process variation, especially the mismatch in the MOM capacitors.

Figure 6:
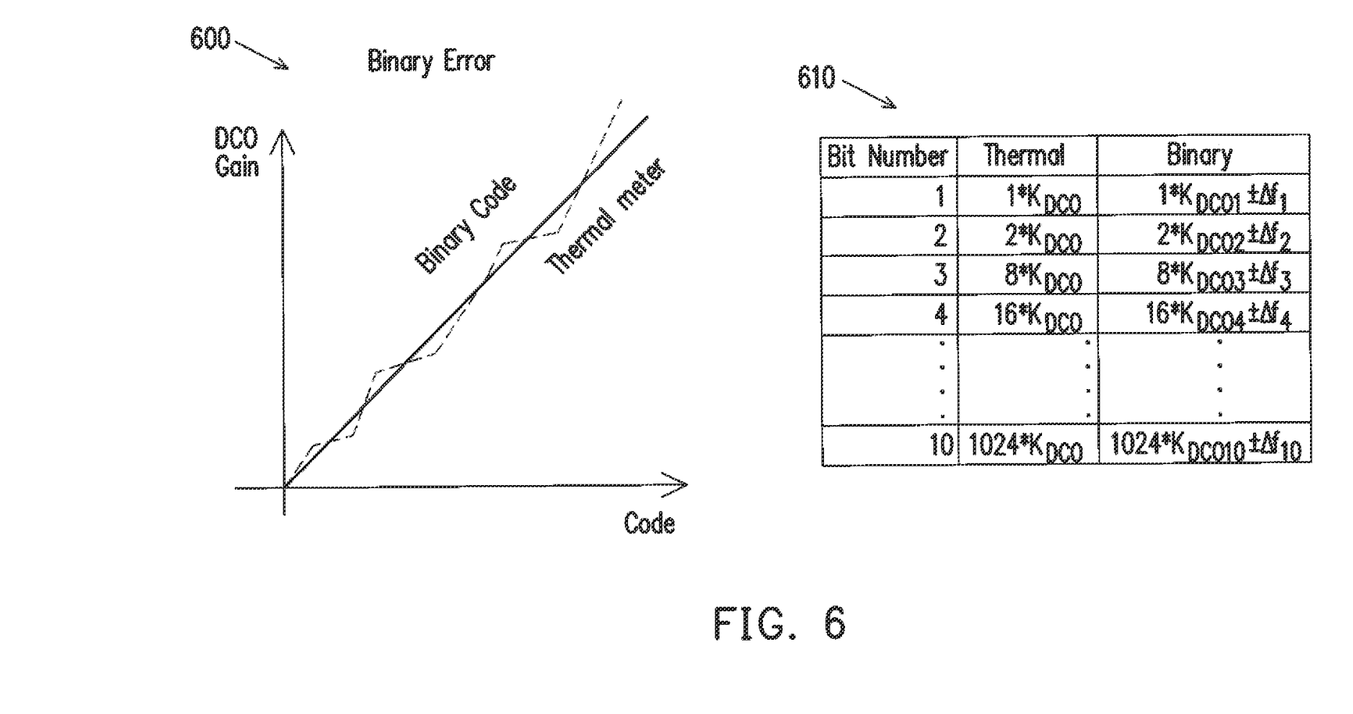
FIG. 6 depicts an example graph of the nonlinearity produced by a binary weighted capacitor bank design, according to some embodiments.

FIG. 6 depicts an example graph 600 and a table 610 that indicate the nonlinearity produced by a binary weighted capacitor bank design, e.g., the binary weighted capacitor bank design 500, according to some embodiments. The DCO gain from ten bits are represented by the figure and the table. A straight line in the graph 600 represents the DCO gain produced by each bit in a thermal meter design, e.g., the thermal meter capacitor bank design 500. Because each bit has an identical layout in the thermal meter capacitor bank design 500, the DCO gain that corresponds to each bit will be also identical. Thus, the line representing the "Thermal meter" DCO gain in graph 600 is straight. The values in the second column in the table 510 under the column heading "Thermal" represent the DCO gain for each bit in the thermal meter capacitor bank design. For example, bit 0 will have a gain of 1*$K_{DCO}$, bit 1 will have a gain of 2*$K_{DCO}$, and bit 2 will have a gain of 4*$K_{DCO}$.

A jagged line in the graph 600 represents a DCO gain produced by each bit in a binary weighted capacitor bank design, e.g., binary weighted capacitor bank design 500. Each bit suffers from process variation of a MOM capacitor. The process variation results in an error, or a deviation from the desired value, in the DCO gain. Each bit will have its own $K_{DCO\,(1:10)}$ normalized to the least significant bit (LSB). For each bit, the DCO gain is offset from the ideal value on the straight line. The offset, or error, can be represented by two parameters, $K_{DCO\,(1:10)}$ and $\Delta f_{(1:10)}$. The values in the third column in the table 610 under the column heading "Binary" represent the DCO gain for each bit. For example, bit 0 will have a gain of 1*$K_{DCO1} \pm \Delta f_1$, bit 1 will have a gain of 2*$K_{DCO2} \pm \Delta f_2$, and bit 2 will have a gain of 4*$K_{DCO4} \pm \Delta f_4$. A different $K_{DCO}$ will result in a larger INL. A different $\Delta f$ will result in a larger DNL. If the different $K_{DCO}$ is a systematic shift, the INL difference could be compensated by the LMS algorithm easily. Then most of the remaining error will be due to the DNL. Because variations caused by temperature and voltage do not impact the binary error, this technique could help to solve the process, voltage, and temperature (PVT) variations.

Figure 7:
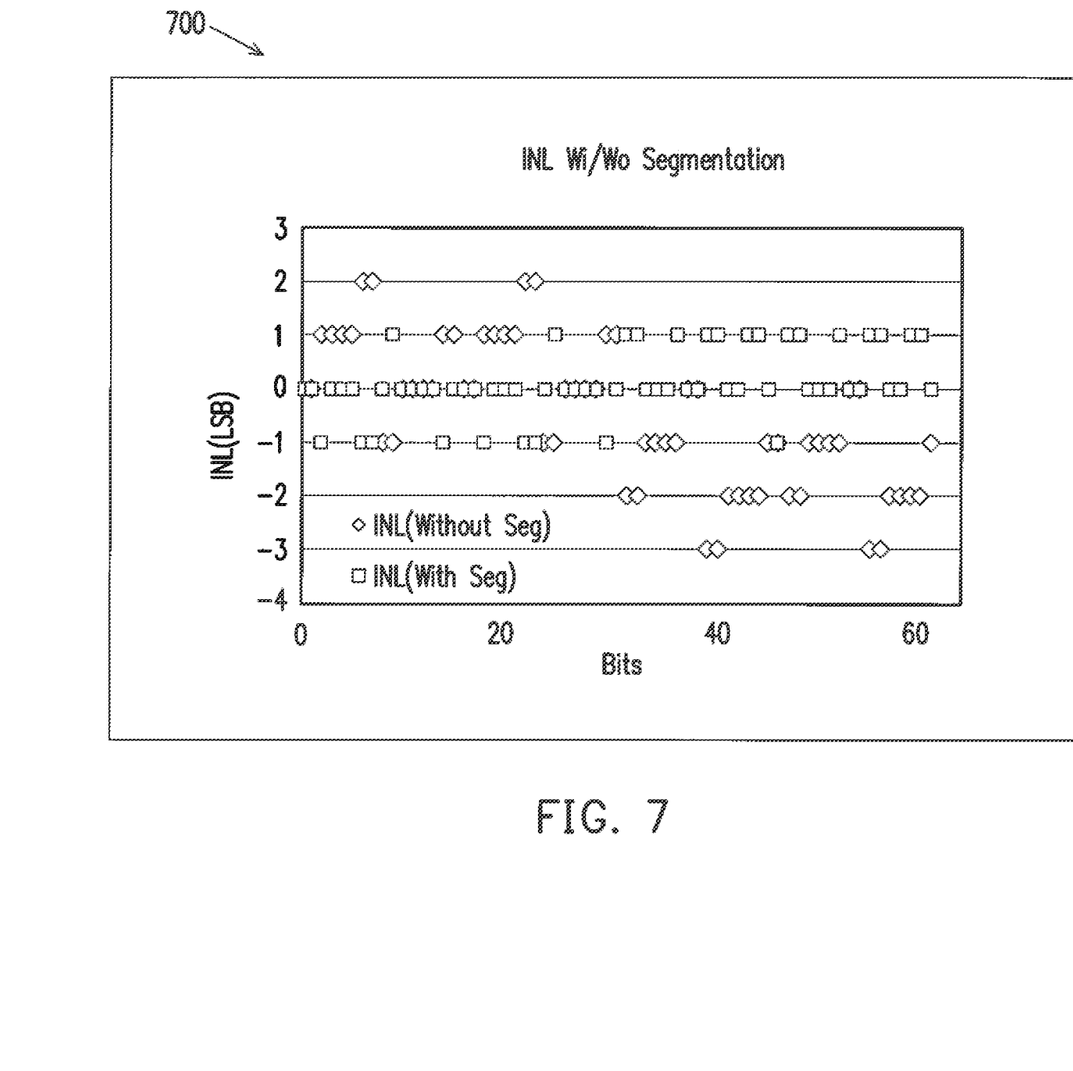
FIG. 7 depicts an example plot of the effect that error compensation can have on integral nonlinearity (INL), according to some embodiments.

FIG. 7 depicts an example of the binary error, specifically the INL, existing in the real silicon for a binary weighted capacitor bank design, e.g., binary weighted capacitor bank design 500, according to some embodiments. There is a random binary error in the silicon that results in the DCO frequency deviating from the ideal value. For example, for the ideal values of 20 kHz, 30 kHz, and 40 kHz, the corresponding actual silicon values might be 30 kHz, 50 kHz, and 80 kHz. In the graph 700, the diamond data points represent INL without, or before, the segmentation superposition technique described herein. The square data points represent the INL with, or after, the segmentation superposition technique described herein. The x-axis represents the number of bits in the binary weighted capacitor bank design. The diamond data points span the range from −3 to 2, whereas the square data points span a tighter range from −1 to 1. As shown by the graph, the INL for most of the numbers of bits in the binary weighted capacitor bank design is reduced after executing the segmentation superposition technique.

Figure 8:
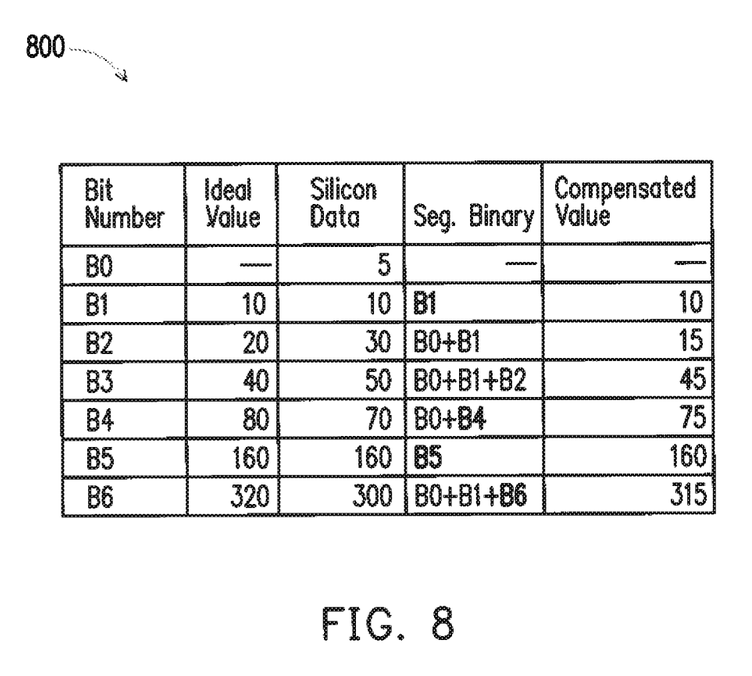
FIG. 8 depicts a table that gives example values and compensation vectors that could be used to compensate the error produced by a binary weighted capacitor bank, according to some embodiments.

FIG. 8 depicts a table 800 that gives example values and compensation vectors that could be used to compensate the error produced by a binary weighted capacitor bank design, e.g., the binary weighted capacitor bank design 500, according to some embodiments. The first column, labeled "Bit Number," represents the bit number used in the binary weighted capacitor bank design. The second column, labeled "Ideal Value," is the ideal frequency value for each corresponding bit number. The third column, labeled "Silicon Data," represents the measured or calculated silicon value for each corresponding bit number. The fourth column, labeled "Seg Binary," represents the segmentation binary, also known as the compensated control word, for each corresponding bit number. The fifth column, labeled "Compensated Value," represents the value of the compensated control word for each corresponding bit number.

In this example, the LSB in the DCO control bits is comprised of an extra bit. This extra bit helps to compensate for errors from the process variation due to the MOM capacitor. The bit number for bit 0, B0, is the extra bit used for compensation purposes. It does not depend on an actual measured silicon value, but rather, it is a calculated value equal to half of the silicon value for bit 1, or B1. The ideal values are based on the expression 10*$2^n$ kHz, where n is the bit number. Thus, the ideal value of B1 is 10*$2^0$ kHz=10 kHz, the ideal value of B2 is 10*$2^1$ kHz=20 kHz, etc. It is of note that there is no ideal value for B0, because it is used merely for compensation purposes and more specifically, in achieving a better resolution of compensation. The extra number of bits for the LSB is not limited to the value of 1, and the number of extra bits depends on what resolution is needed for the DCO output frequency. In addition, the LSB in this embodiment is comprised of the extra bit. However, in another embodiment, a most significant bit (MSB) could be comprised of the extra bit.

Each compensated control word in the "Seg Binary" column is formed based on a comparison of an ideal value to an actual silicon measurement for a particular bit. Each bit will need to be optimized and tuned to achieve a compensated value. This compensated value may be equal to the ideal value, but it is not necessarily equal to the ideal value. Ideally, the difference between the compensated value and the ideal value should be less than the difference between the actual value and the ideal value.

As an example, for bit 1, the ideal value is 10 kHz, and the Silicon measured value is 10 kHz. Since there is no offset between the ideal and measured values, the compensated control word is just the Silicon measured value for B1—10 kHz. As another example, for bit 3, the ideal value is 40 kHz, and the Silicon measured value is 50 kHz. There is a 10 kHz offset between the ideal and measured values. The compensated control value can get closer to the ideal value by using the compensated control word consisting of the Silicon measured values for B0, B1, and B2. The compensated value is 5 kHz+10 kHz+30 kHz=45 kHz.

After executing the segmentation superposition technique described herein, the binary error between the ideal and actual silicon value could be reduced to half of 1 LSB, depending on the value of the extra bit below ideal LSB. In the exemplary design, 1 extra bit was used because it was enough to meet system requirements. The number of the extra bit is not limited to a specific integer number. Though the extra LSB corresponds in this example corresponds to 5 kHz in the DCO tuning bank, it could correspond to a different value, e.g., 2 kHz. In this case, the INL variation could be reduced from 5 LSB to 2 LSB.

Figure 9:
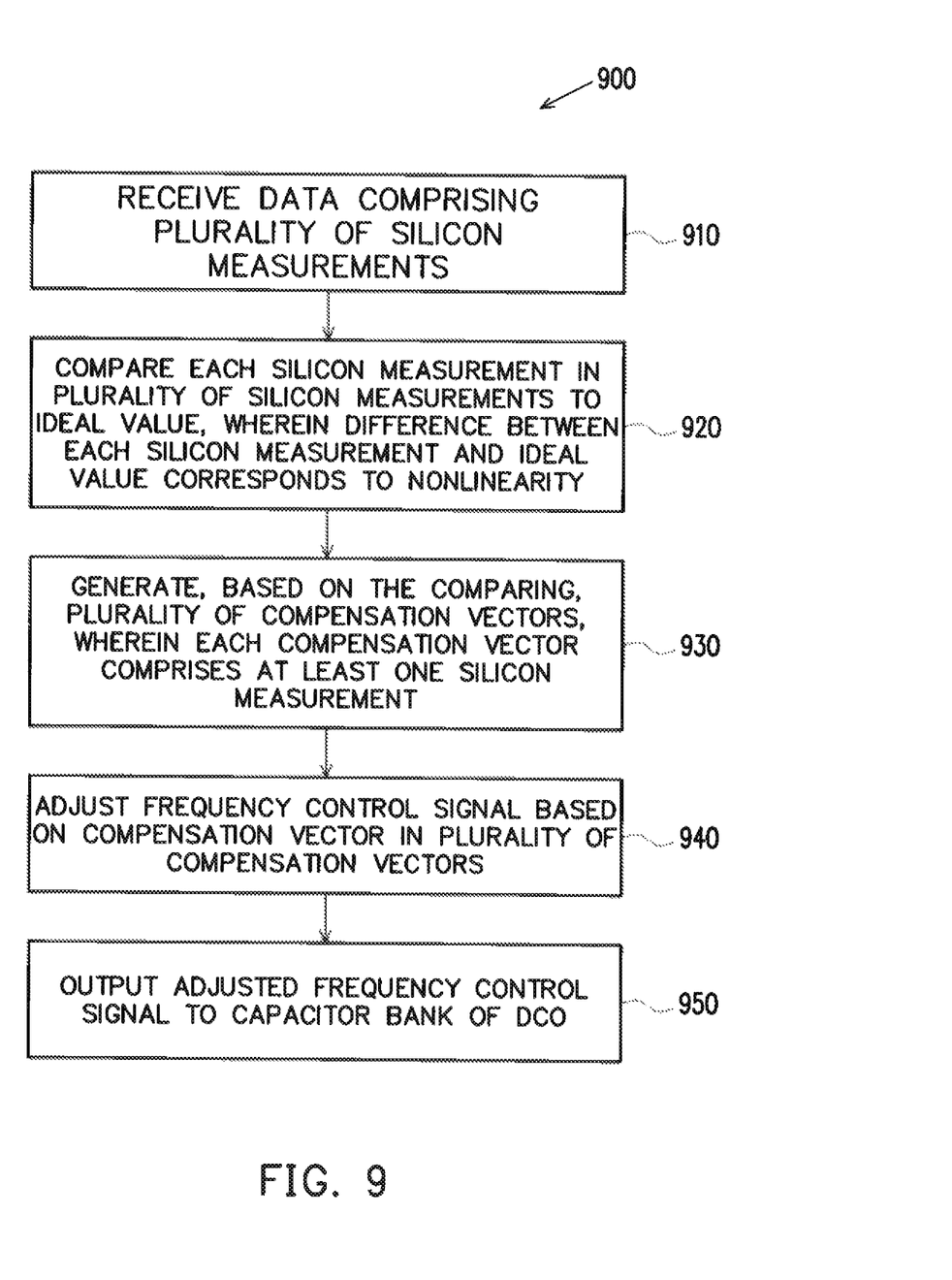
FIG. 9 depicts an example flow diagram depicting a process for compensating the error produced by a binary weighted capacitor bank, according to some embodiments.

FIG. 9 depicts an example flow diagram 900 depicting a process for compensating a nonlinearity of a DCO, comprising:, e.g., the DCO 350, according to some embodiments. The process of FIG. 9 is applicable to many different hardware configurations, but for clarity, it is described with reference to structures in FIGS. 1 and 3. At 910, data comprising a plurality of silicon measurements is received. As one example, in FIG. 8, the table 800 indicates silicon measurements for bits B0 through B6. The plurality of silicon measurements is received by the segmentation superposition module, e.g. segmentation superposition module 305. The plurality of silicon measurements may be received by and stored in a compensation lookup table, e.g., compensation lookup table 320. Each silicon measurement in the plurality of silicon measurements is compared to an ideal value, the difference between each silicon measurement and the ideal value corresponding to the nonlinearity, at 920. As one example, in FIG. 8, the table 800 indicates ideal values for bits B1 through B6. B0 is an extra bit, and it does not have a corresponding ideal value; B0 is used for compensatory purposes. For some of the bits—B2, B3, B4, and B6—there is an offset between the ideal value and the silicon measurement. The comparison is performed by the segmentation superposition module, e.g. segmentation superposition module 305. The comparison may be performed by and stored in the compensation lookup table, e.g., compensation lookup table 320. At 930, a plurality of compensation vectors is generated based on the comparing, wherein each compensation vector comprises at least one silicon measurement. The plurality of compensation vectors, e.g., segmentation binaries corresponding to bits B1 through B6 in the table 800, is stored in the compensation lookup table, e.g., compensation lookup table 320. A frequency control signal is adjusted based on a compensation vector in the plurality of compensation vectors at 940. The frequency control signal adjustment is performed by a summation block, e.g., summation block 330. At 950, the adjusted frequency control signal is output to a capacitor bank, e.g., capacitor bank 140 of the DCO, e.g., DCO 130 or DCO 350.

Systems and methods as described herein can offer a more compact capacitor bank design and less parasitic capacitance, while eliminating or reducing phase error in the DCO output.

In one embodiment, a method for compensating a nonlinearity of a digitally controlled oscillator (DCO) is provided. Data comprising a plurality of silicon measurements is received. Each silicon measurement in the plurality of silicon measurements is compared to an ideal value. A plurality of compensation vectors, wherein each compensation vector comprises at least one silicon measurement, is generated based on the comparing. A frequency control signal is adjusted based on a compensation vector in the plurality of compensation vectors. The adjusted frequency control signal is outputted to a capacitor bank of the DCO.

In another embodiment, a segmentation superposition module for controlling a digitally controlled oscillator (DCO) to generate a compensated frequency output is provided. The segmentation superposition module comprises at least one data processor and a non-transitory computer-readable medium encoded with instructions for commanding the at least one data processor to execute steps of a process. The steps of the process include: receiving an original frequency control signal, wherein the original frequency control signal is associated with a desired output frequency; accessing a compensation vector associated with a value of the original frequency control signal, wherein the accessed compensation vector accounts for a frequency offset produced by capacitors in a capacitor tuning bank of the DCO, wherein the capacitors are associated with the desired output frequency; adjusting the original frequency control signal based on the accessed compensation vector; and controlling, based on the adjusted original frequency control signal, switches in the capacitor bank to generate the compensated frequency output.

In yet another embodiment, a digitally controlled oscillator is provided. The digitally controlled oscillator comprises a plurality of capacitors; a plurality of switches operatively connected to the plurality of capacitors; and a segmentation superposition module. The segmentation superposition module comprises: a non-transitory computer-readable medium for storing compensation factors associated with nonlinearities produced by the plurality of capacitors; wherein the segmentation superposition module is configured to adjust a frequency control signal output to the plurality of switches based on a compensation vector stored in the non-transitory computer-readable medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for compensating a nonlinearity of a digitally controlled oscillator (DCO), comprising:
   receiving data comprising a plurality of silicon measurements;
   comparing each silicon measurement in the plurality of silicon measurements to an ideal value, wherein a difference between each silicon measurement and the ideal value corresponds to the nonlinearity;
   generating, based on the comparing, a plurality of compensation vectors, wherein each compensation vector comprises at least one silicon measurement;
   adjusting a frequency control signal based on a compensation vector in the plurality of compensation vectors; and
   outputting the adjusted frequency control signal to a capacitor bank of the DCO.

2. The method of claim 1, wherein the ideal value corresponds to a value in a linear DCO gain output curve.

3. The method of claim 1, wherein the plurality of compensation vectors are stored in (n+1) by (M+1) matrix format, wherein n is greater than M.

4. The method of claim 1, wherein the plurality of silicon measurements are stored in at least one of a plurality of registers and a memory.

5. The method of claim 1, wherein the method further comprises:
measuring, prior to the receiving, the nonlinearity of the capacitor bank.

6. The method of claim 1, wherein the capacitor bank of the DCO is a binary weighted capacitor bank.

7. The method of claim 1, wherein at least one compensation vector in the plurality of compensation vectors further comprises a compensation factor, and wherein a value of the compensation factor is distinct from each of the silicon measurements.

8. A segmentation superposition module for controlling a digitally controlled oscillator (DCO) to generate a compensated frequency output, comprising:
at least one data processor;
a non-transitory computer-readable medium encoded with instructions for commanding the at least one data processor to execute steps of a process that include:
receiving an original frequency control signal, wherein the original frequency control signal is associated with a desired output frequency;
accessing a compensation vector associated with a value of the original frequency control signal, wherein the accessed compensation vector is based on a measured capacitor nonlinearity and accounts for a frequency offset produced by capacitors in a capacitor bank of the DCO, wherein the capacitors are associated with the desired output frequency;
adjusting the original frequency control signal based on the accessed compensation vector; and
controlling, based on the adjusted original frequency control signal, switches in the capacitor bank to generate the compensated frequency output.

9. The system of claim 8, wherein the steps further comprise:
measuring, prior to the accessing, a nonlinearity of the capacitor bank.

10. The system of claim 9, wherein the steps further comprise:
generating, prior to the accessing, a plurality of compensation vectors based on the measured nonlinearity of the capacitor bank.

11. The system of claim 10, wherein the plurality of compensation vectors are stored in (n+1) by (M+1) matrix format.

12. The system of claim 8, wherein the capacitor bank of the DCO is a binary weighted capacitor bank.

13. The system of claim 8, wherein the frequency offset is reduced or eliminated.

14. The system of claim 8, wherein the accessed compensation vector further comprises a compensation factor, and wherein a value of the compensation factor is distinct from an individual contributions to the frequency offset produced by each of the capacitors.

15. A digitally controlled oscillator (DCO), comprising:
a plurality of capacitors;
a plurality of switches operatively connected to the plurality of capacitors; and
a segmentation superposition module comprising:
a non-transitory computer-readable medium for storing compensation factors associated with nonlinearities produced by the plurality of capacitors, a particular compensation factor being based on a measured capacitor nonlinearity;
wherein the segmentation superposition module is configured to adjust a frequency control signal output to the plurality of switches based on a compensation vector stored in the non-transitory computer-readable medium.

16. The digitally controlled oscillator of claim 15, wherein the digitally controlled oscillator is used in an all-digital phase locked loop (ADPLL).

17. The digitally controlled oscillator of claim 15, wherein the compensation vectors are stored in (n+1) by (M+1) matrix format.

18. The digitally controlled oscillator of claim 15, wherein the compensation factors are stored in at least one of a plurality of registers and a memory.

19. The digitally controlled oscillator of claim 15, wherein a compensation factor in the compensation factors corresponds to a frequency offset between a desired frequency produced by a capacitor and a measured frequency produced by the capacitor.

20. The digitally controlled oscillator of claim 15, wherein the plurality of capacitors is a binary weighted capacitor bank.

* * * * *